(12) United States Patent
Lombardi et al.

(10) Patent No.: US 8,188,597 B2
(45) Date of Patent: May 29, 2012

(54) FIXTURE TO CONSTRAIN LAMINATE AND METHOD OF ASSEMBLY

(75) Inventors: Thomas E. Lombardi, Poughkeepsie, NY (US); Donald Merte, Yorktown Heights, NY (US); Gregg B. Monjeau, Wallkill, NY (US); David L. Questad, Hopewell Junction, NY (US); Son K. Tran, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/887,809

(22) Filed: Sep. 22, 2010

(65) Prior Publication Data

US 2012/0070940 A1 Mar. 22, 2012

(51) Int. Cl.
*H01L 23/34* (2006.01)
(52) U.S. Cl. ........ 257/727; 257/726; 257/716; 257/699; 257/687; 257/E23.084
(58) Field of Classification Search .................. 257/726, 257/727, 716, 699, 687; 438/121
See application file for complete search history.

(56) References Cited

U.S. PATENT DOCUMENTS

| | | | |
|---|---|---|---|
| 6,020,221 A | 2/2000 | Lim et al. | |
| 6,337,509 B2 | 1/2002 | Cokely et al. | |
| 6,518,666 B1 | 2/2003 | Ikeda | |
| 6,995,033 B2 * | 2/2006 | Prior | 438/60 |
| 7,015,066 B2 | 3/2006 | Tsao et al. | |
| 7,473,618 B1 | 1/2009 | Danovitch et al. | |
| 7,736,459 B2 | 6/2010 | Matsumura | |
| 2004/0238115 A1 | 12/2004 | Matsuno et al. | |
| 2008/0219482 A1 * | 9/2008 | Sato | 381/174 |
| 2009/0266972 A1 | 10/2009 | Goldmann | |

OTHER PUBLICATIONS

J.C. Suhling et al., "Measurement of backside flip chip die stresses using piezoresistive test die", Proc. 1999 IMAPS Conf., Oct. 26-28, 1999, pp. 298-303.
S.Y. Yang et al., "Solder reflow process induced residual warpage measurement and its influence on reliability of flip-chip electronic packages", Microelectronics Reliability, vol. 46, 2006, pp. 512-522.
U.S. Appl. No. 12/551,960 filed on Sep. 1, 2009.

* cited by examiner

*Primary Examiner* — Jarrett Stark
(74) *Attorney, Agent, or Firm* — Joe Petrokaitis; Roberts Mlotkowski Safran & Cole, P.C.

(57) ABSTRACT

A fixture assembly and method of forming a chip assembly is provided. The fixture assembly includes a first plate having an opening sized to accommodate a chip mounted on a laminate. The fixture assembly further includes a second plate mated to the first plate by at least one mechanical fastening mechanism. The fixture assembly further includes a space defined by facing surfaces of the first plate and the second plate and confined by a raised stepped portion of at least one of the first plate and the second plate. The space is coincident with the opening. The space is sized and shaped such that the laminate is confined within the space and directly abuts the stepped portion and the facing surfaces of the first plate and the second plate to be confined in X, Y and Z directions.

16 Claims, 5 Drawing Sheets

FIXTURE TO CONSTRAIN LAMINATE AND METHOD OF ASSEMBLY

FIELD OF THE INVENTION

The invention relates to an apparatus of making a chip assembly and method of manufacturing the chip assembly and, more particularly, to a fixture used for assembling a silicon (Si) chip onto a substrate in order to eliminate cracking or delamination of the chip assembly by reducing or preventing warping or bending of the laminate, and reducing laminate CTE.

BACKGROUND

Flip chip is a process in which a semiconductor Si chip is flipped over so that the connection pads face towards the substrate (laminate). In the conventional flip chip bonding, ceramic carriers, typically alumina, have been used in combination with solder as the laminate. However, the need for high-density interconnects in cost-effective flip chip packaging has been a motivation for using organic laminates. In contrast to ceramic substrates, organic laminates have better electrical performance at lower cost. However, when organic laminates are used for the flip chip assembly, laminate bending and warpage can occur due to a thermal mismatch between materials, e.g., organic laminate and chip. The bending and warpage can increase as the size of the organic laminate increases for high performance chips and components, and as the thickness of the organic laminate decreases, for example in coreless laminates.

For high performance flip chip applications, Cu low-k dielectric layers are widely used in the Back-End-of-Line (BEOL) structure of Si chips to reduce capacitance in the interconnect layers. In recent applications of flip chips, ultra low-k dielectric materials are used for lower capacitance. These materials are more fragile than traditional BEOL dielectrics and more susceptible to damage during assembly.

During the flip chip assembly process, the Si chip and the organic laminates experience a temperature cycle from room temperature to the melting temperature of solder materials back to room temperature during cool down. The coefficient of thermal expansion (CTE) mismatch between a Si chip and an organic laminate creates thermally-induced stress/strain in the flip-chip structure during the flip chip assembly process.

The thermally-induced stress/strain in the flip-chip structure often results in a failure of the BEOL structure such as, for example, cracking or delamination. This failure is becoming more common because of the fragility of low-k dielectric layers. This thermally-induced stress/strain can become even more problematic with the use of lead-free solders.

More specifically, due to the thermal expansion mismatch between organic laminates (approximately $17 \times 10^{-6}$/C) and silicon chips (approximately $2.6 \times 10^{-6}$/C), there are stresses produced during cool-down of the modules from the chip join temperature. In a die with fragile low-k dielectric materials in the BEOL, coupled with lead-free bump metallurgies which are higher modulus than leaded bumps, the result is ultra-low dielectric constant (ULK) cracking on cool-down, i.e., "white bumps" observed by CSAM (Scanning Acoustic Microscopy in C mode). "White bumps"/ULK cracking is a very serious problem which needs to be resolved in order to successfully implement lead-free bump technology on organic packages for 45 nm and 32 nm silicon technology nodes, and beyond. This phenomenon is not observed when joining the same die to glass-ceramic modules, which are CTE-matched to silicon, and this phenomenon is not observed when using leaded bumps on organic packages, due to the lower yield stress of the high-lead bumps imparting less stress to the system.

There are several approaches available to mitigate white bumps, including the use of slower cool-down rates during chip join, use of less silver content in the lead-free Cu—Ag alloy. However, these approaches have issues. For example, the slow cool-down rates required to totally alleviate white bumps are non-manufacturable due to excessive time and/or need for impractically long belt furnaces. The use of less silver in the lead-free alloy may not be easily implemented due to electrical requirements.

Accordingly, there exists a need in the art to overcome the deficiencies and limitations described hereinabove.

SUMMARY

In a first aspect of the invention a fixture assembly comprises a first plate having an opening sized to accommodate a chip mounted on a laminate. The fixture assembly further comprises a second plate mated to the first plate by at least one mechanical fastening mechanism. The fixture assembly further comprises a space defined by facing surfaces of the first plate and the second plate and confined by a raised stepped portion of at least one of the first plate and the second plate. The space is coincident with the opening. The space is sized and shaped such that the laminate is confined within the space and directly abuts the stepped portion and the facing surfaces of the first plate and the second plate to be confined in X, Y and Z directions.

In another aspect of the invention, a chip assembly apparatus comprises a first plate having a stepped feature and an opening. The chip assembly apparatus further comprises a second plate mated to the first plate. The second plate has a stepped feature which when the first plate and the second plate are mated, form a confined space with the stepped feature of the first plate. The chip assembly apparatus further comprises at least one mechanical fastening mechanism to mate the first plate to the second plate. In the confined space, contact is made to a top surface of a laminate about a periphery and to a bottom surface of the laminate by the first plate and the second plate, respectively, and sides of the laminate by the stepped features of the first plate and the second plate.

In yet another aspect of the invention, a method of joining a chip on a laminate comprises positioning a laminate having a top surface, a bottom surface and sides on a surface of a first plate of a fixture and directly abutting against a stepped feature. The method further comprises positioning a second plate of the fixture on the top surface of the laminate about a periphery thereof. The method further comprises mating the first plate and the second plate by one or more mechanical fasteners. The method further comprises placing a chip on the laminate through an opening in the first plate. The method further comprises reflowing solder to connect the chip on the laminate. When the first plate and the second plate are mated and the laminate is directly abutting the stepped feature, the laminate is constrained in X, Y and Z directions during assembly processes.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to an apparatus for making a chip assembly and method of manufacture the chip assembly and, more particularly, to a fixture used for assembling a silicon (Si) chip onto a laminate. Advantageously, the fixture eliminates or minimizes cracking or delamination of the chip assembly by reducing or preventing warping or bending of the laminate and reducing CTE mismatch between chip and laminate. More specifically, the fixture of the present invention is used for assembling a silicon (Si) chip onto an organic laminate. In embodiments, the fixture is designed to constrain the organic laminate in the X, Y and Z directions which reduces or prevents warping or bending of the organic laminate. The reduction or prevention of warpage or bending and reduction of CTE mismatch, in turn, minimizes or eliminates cracking or delamination of the chip assembly.

In embodiments, the fixture has a thermal expansion (CTE) which closely matches the organic laminate and preferably has a lower CTE than the organic laminate. For example, the fixture can have a CTE of $17 \times 10^{-6}$ or less and a CTE of $11 \times 10^{-6}$ or less and a CTE of $3 \times 10^{-6}$ or less. The fixture can be made from any material that can constrain the laminate and provide such a CTE such as, for example, Invar, stainless steel and machinable glass ceramic.

Figure 1:
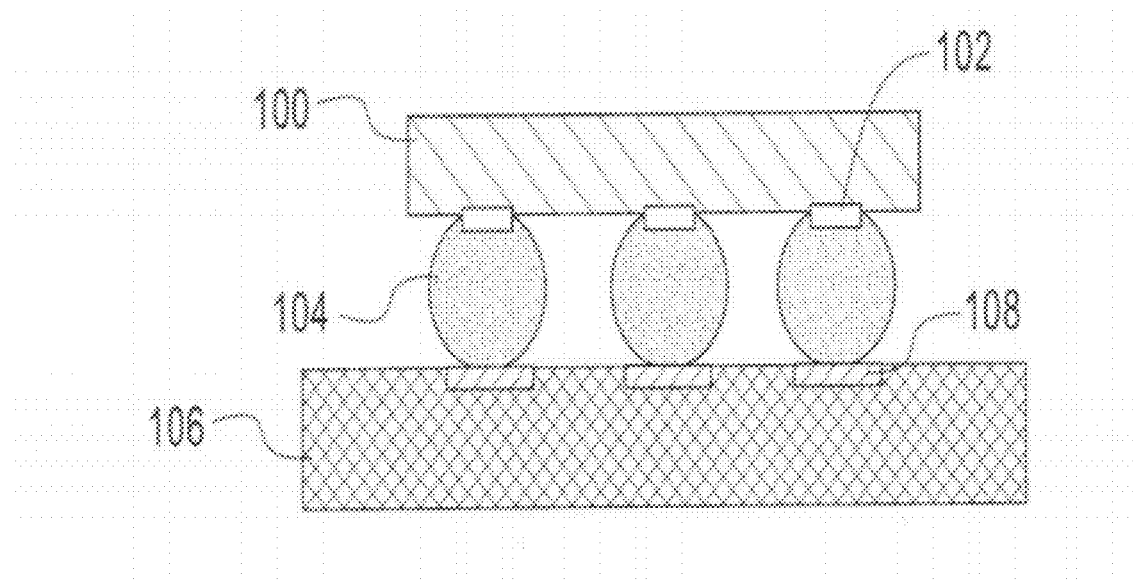
FIG. 1 shows a chip assembly in accordance with aspects of the present invention.

FIG. 1 shows a chip assembly in accordance with aspects of the present invention. The chip assembly includes a chip 100, such as a silicon (Si) chip. For next-generation chips 100, the dielectric constant is decreasing, and those materials with lower dielectric constant (alternatives to silicon dioxide, etc) have lower modulus and lower strengths, so those ULK layers are more prone to damage and delamination and cracking due to the thermal expansion mismatch between the organic laminate and the silicon chip during chip join reflow, and cool down. Thus the "white bumps" (e.g., damage/cracking) in the ultra-low dielectric constant layers have been found to be the "weakest links" in the overall chip stack.

The chip 100 includes a plurality of ball or bump limiting metallurgy contacts (BLM) 102 formed along a surface of the chip 100. The BLM 102 correspond to inputs/outputs (I/Os) of the chip 100. A solder bump 104 is placed on each BLM 102. The chip 100 is connected to a laminate 106, such as an organic laminate (substrate). In embodiments, the laminate 106 may be, for example, a coreless laminate, as well as laminates with cores (e.g., thin core or thick core). In embodiments, a typical laminate of 55 mm in the XY size with a CTE of $17 \times 10^6/°$ C. would expand approximately 0.21 mm (8 mils) from room temperature to 250° C. The CTE of the chip is about $2.6 \times 10^{-6}/°$ C. The laminate 106 includes a plurality of pads 108. During a flip chip assembly process, the chip 100 is placed onto the laminate 106 so that the bumps 104 align with the respective pads 108 of the laminate 106. This portion of the assembly process is normally conducted at ambient room temperature.

Figure 2:
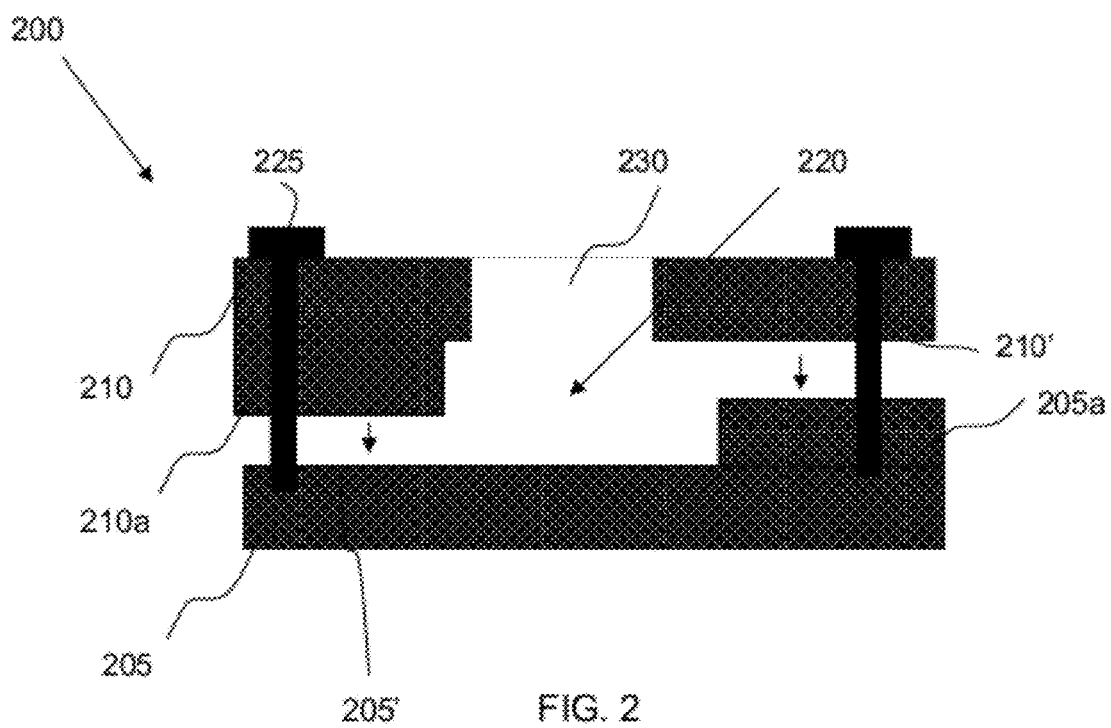
FIG. 2 shows an exploded cross-sectional view of a fixture in accordance with aspects of the invention.

FIG. 2 shows an exploded cross-sectional view of a fixture in accordance with aspects of the invention. In accordance with aspects of the present invention, the fixture 200 includes a top plate 205 and a bottom plate 210, each having a surface 205' and 210' respectively. The top plate 205 and the bottom plate 210 include stepped portions 205a, 210a, respectively. In the assembled stated, the stepped portions 205a, 210a each contact a respective surface 205' and 210' of the top plate 205 and bottom plate 210, forming a confined space 220 which accommodates the laminate and chip assembly (shown in FIG. 1). The top plate 205 and the bottom plate 210 are mated together by, for example, mechanical fastener 225 such as, for example, clamps, bolts, screws, pins, clips, fasteners, etc. An opening 230 is provided in the top plate 205 to accommodate the chip and related components.

In embodiments, the fixture 200 can accommodate any tolerances in laminate XYZ size, so that the laminate can be fit snugly into the fixture 200 at room temperature, e.g., no space between the surfaces of the fixture and the laminate. For example, the space 220 can be about 55 mm in the XY dimension to accommodate a laminate of 55 mm. The height (e.g., Z direction) of the stepped portions 205a, 210a can be structured, sized and/or configured to accommodate any sized (e.g., thickness) laminate. For example, the height of the stepped portions 205a, 210a can be the thickness of the laminate (e.g., about 0.8 mm (30 mils)) or slightly smaller (e.g., about 0.1 mm smaller). However, it should be understood by those of skill in the art that other dimensions are also contemplated by the present invention, depending on the dimensions of the laminate.

The fixture 200 of the present invention will have a low expansion, e.g., less than about $17 \times 10^{-6}/°$ C. and more specifically less than about $11 \times 10^{-6}/°$ C. and even more specifically less than about $3 \times 10^{-6}/°$ C. In embodiments, the material for the fixture 200 can be, for example, Invar or stainless steel such as, for example, 4000 series stainless steel or 304 stainless steel, amongst other materials such as machinable glass ceramic. In this way, the fixturing can constrain (e.g., prevent) the laminate expansion by expanding less than the laminate during assembly processing. Also, the pressure applied by the top plate 205 and bottom plate 210 to the laminate oppose bending and warping of the laminate and prevent lateral expansion of the laminate (e.g., by the stepped portions).

Figure 3A:
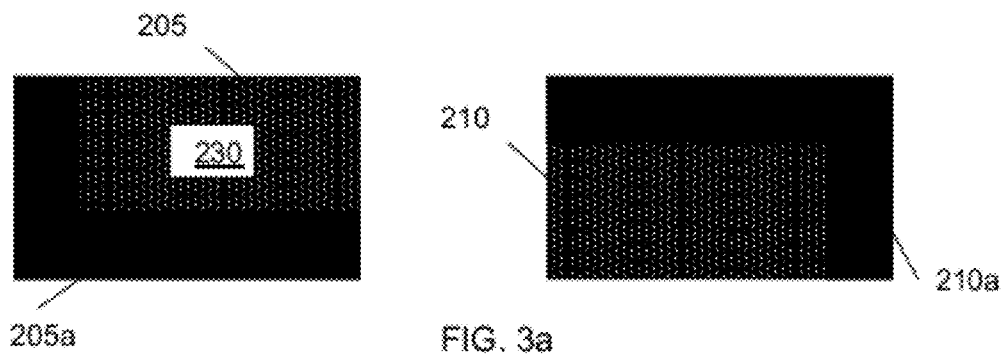
FIGS. 3a-3d show various configurations of stepped portions of the fixture in accordance with aspects of the present invention.
Figure 3B:
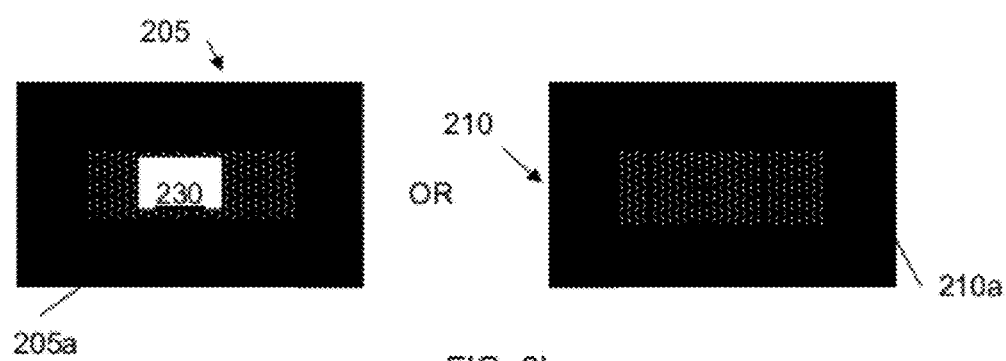
Figure 3C:
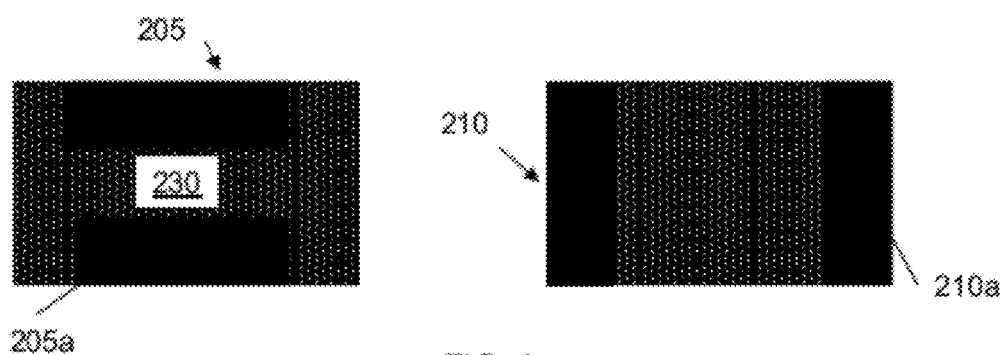
Figure 3D:
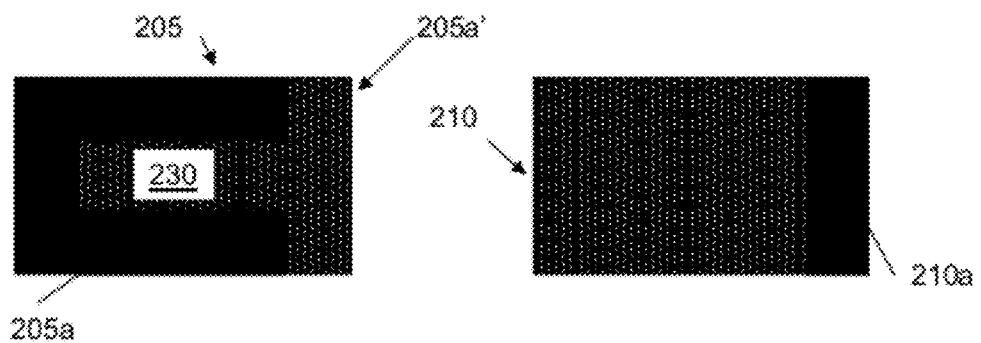

FIGS. 3a-3d show various configurations of the stepped portions of the fixture in accordance with aspects of the present invention. For example, FIG. 3a shows the top plate 205 and bottom plate 210 both having L-shaped stepped portions 205a, 210a. In FIG. 3b, the top plate 205 or the bottom plate 210 has a picture frame configuration (e.g., a closed perimeter which matches the shape and size of the laminate). In FIG. 3c, the top plate 205 has stepped portions 205a on sides, and the bottom plate 210 has stepped portions 210a on a top and bottom of the fixture, or vice versa. In embodiments, either of the stepped portions can extend the entirety of the length or width of the plate. In FIG. 3d, the top plate 205 has a "U" shaped stepped portion 205a and the bottom plate 210 has a stepped portion 210a, which matches an open portion 205a' of the U-shaped stepped portion 205a, or vice versa. In the embodiment of FIG. 3d, the U shaped stepped portion can be in any orientation, e.g., the open end facing up, down or towards either side. In each configuration of FIGS. 3a-3d, the stepped portions 205a, 210a form a closed spaced 220 to ensure that all sides of the laminate are snugly held in place, e.g., directly abuts the surfaces of the stepped portions 205a, 210a.

Figure 4:
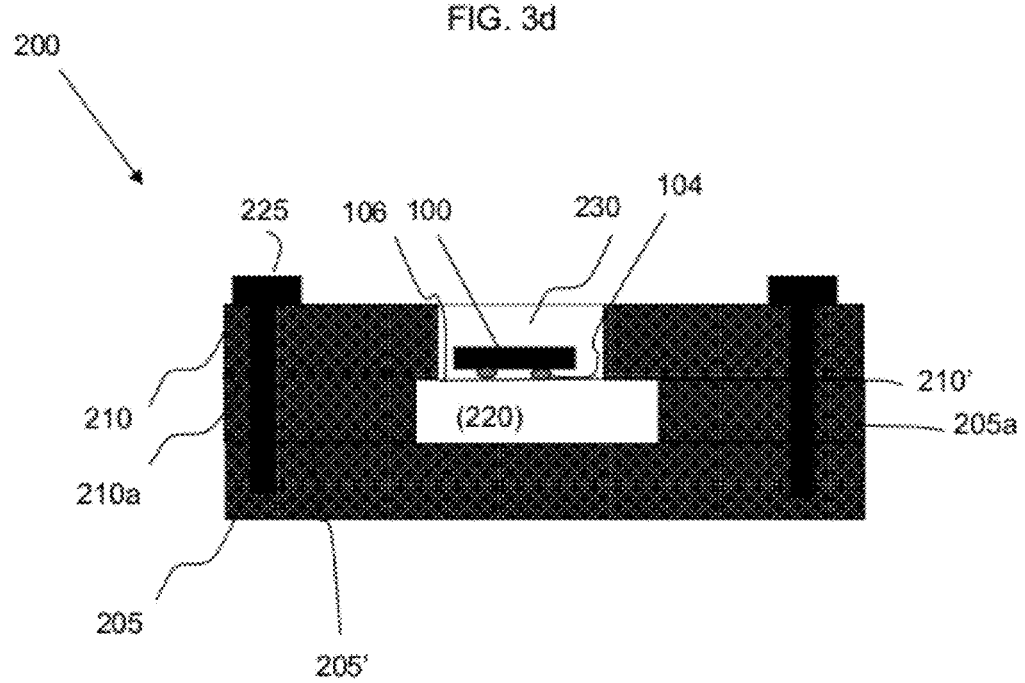
FIG. 4 shows the assembled fixture with the chip assembly mounted therein in accordance with aspects of the present invention.

FIG. 4 shows the assembled fixture in accordance with aspects of the present invention. In embodiments, the space 220 is sized such that the fixture 200 constrains the laminate 106 in the X, Y and Z directions, prior to chip placement and subsequent chip join reflow. More specifically, the space 220 is sized and configured such that there is no room (space) for the laminate 106 to expand or contract in the X, Y and Z directions during assembly processes. Even more specifically, the space 220 is sized and configured such that the laminate 106 is firmly contacted on all sides (e.g., held snugly) by surfaces of the stepped portions 205a, 210a to prevent lateral expansion, as well on the top and bottom surfaces of laminate 106 by the surfaces 205', 210' of the fixture. In embodiments, the laminate 106 is banked (directly abut) against the stepped portions 205a, 210a in the fixture 200, and the chip 100 can be mounted in an opening 230 formed by in the top plate 210. The laminate is positioned such that the top plate 205 of the fixture 200 is provided on the top surface of the laminate 205 about an entire periphery, and there is no gap between the stepped portion(s) and the laminate 106. This configuration prevents lateral expansion of the laminate and warpage or bending. The laminate 106 can be, for example, an organic laminate, a core laminate or a coreless laminate, amongst other configurations.

In embodiments, the top plate 205 and the bottom plate 210 are mated together to constrain the laminate 106 in X, Y and Z. The top plate 205 and the bottom plate 210 can be secured with varying degrees of force to adjust the pressure that top plate 205 and the bottom plate 210 apply to the laminate. The Z constraint can be controlled by controlling the size of the stepped portions 205a, 210a of the top plate 205 and bottom plate 210. Also, the XYZ constraint can be controlled by controlling how tightly the laminate is constrained in XYZ directions prior to tightening the mechanical fasteners, e.g., screws, bolts, clamps, pins, fasteners, etc. In embodiments, a pressure is applied to the laminate on the top, bottom and all sides, by the facing surfaces 205', 210', and the stepped portions 205a, 210a. The fixture 200 can be modified to accommodate capacitors on the top surface of the laminate 106 by cutting out single holes or grooves to accommodate capacitor placement as necessary, depending on the number of capacitors and layout, etc. on a given package.

Figure 5:
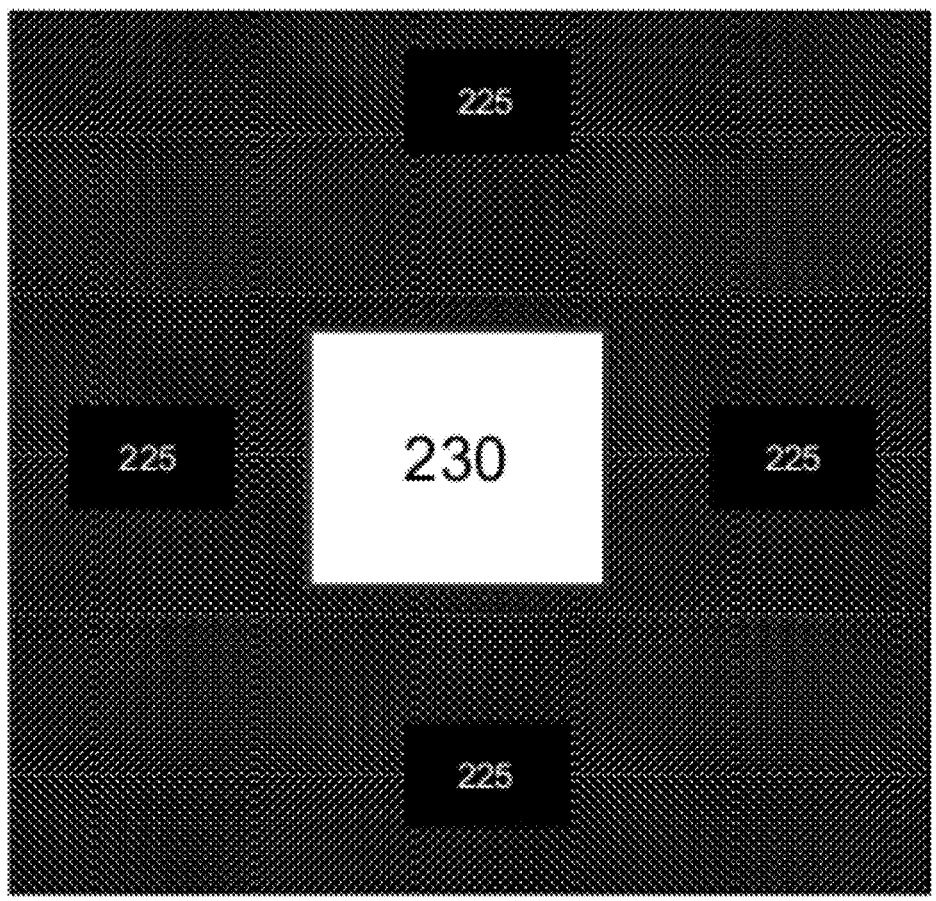
FIG. 5 shows a top view of either the top plate or bottom plate of the fixture in accordance with aspects of the present invention.

FIG. 5 shows a top view of either the top plate or bottom plate of the fixture in accordance with aspects of the present invention. The representative view of FIG. 5 can either be in the assembled or non-assembled state. In embodiments, the plate (205, 210) includes a mechanical fastener 225. The mechanical fastener 225 is structured and designed to mate the plates 205, 210 together, with the laminate mounted within the space 220 formed by the stepped portions 205a, 210a. The mechanical fastener 225 can be a plurality of mechanical fasteners 225, each provided on a side of the plate or other configuration such as, for example, a plurality on each side of the plate, at corners of the plate, etc. The top plate 210 can include the opening 230 to accommodate the mounting of the chip 100 and related components.

Figure 6:
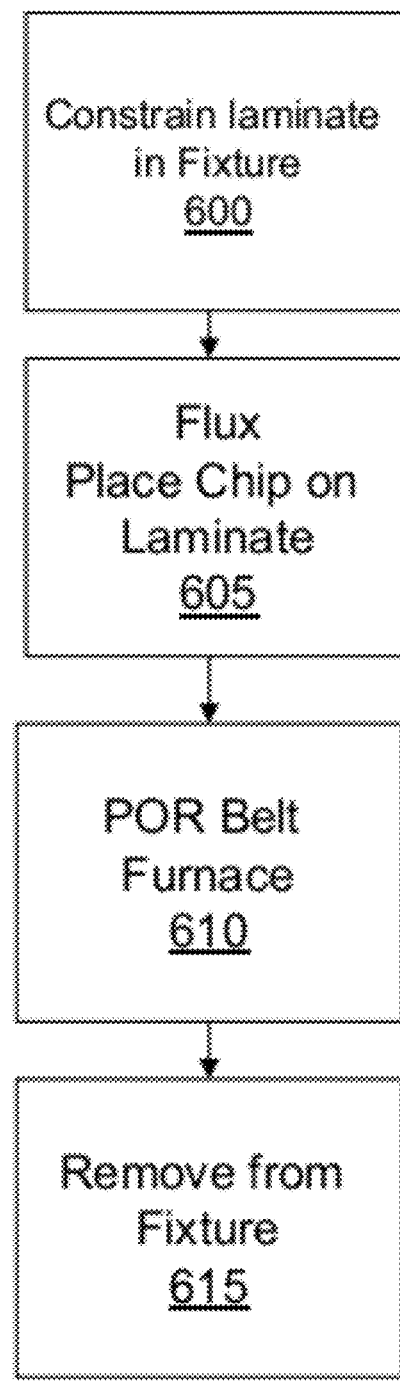
FIG. 6 shows a flow diagram of a process in accordance with aspects of the invention.

FIG. 6 shows a flow diagram of a method in accordance with aspects of the present invention. At step 600, the laminate is constrained in the fixture. This can be performed by placing the laminate against a stepped portion of the bottom plate (directly abutting), placing the top plate on top of the laminate and the bottom plate, and mating the top and bottom plates together by use of the mechanical fasteners. At step 605, after the laminate is constrained in the fixture, the chip can be placed on the laminate by plan of record (POR) methods fluxing and chip placement via the opening (e.g., cut-out) in the top plate of the fixture. At step 610, the assembly is sent through a POR belt furnace which has been profiled to accommodate the mass of the laminate, chip and fixture, to achieve the proper reflow temperature (e.g., for lead-free packages, approximately 245° C.+/−10° C.). At step 615, after reflow, the joined module is removed from the fixture and sent through flux cleaning Due to the XYZ constraint of the laminate expansion during chip joining, cool down stresses will be mitigated and there will be minimal white bumps observed. By adjusting CTE of fixture materials, the in-plane deformation of the substrate can be modified. For complete restriction constraint, modeling shows a 31% reduction in delamination stress.

The configuration of the fixture 200 advantageously reduces the effective XYZ CTE of the laminate, such that on cooling from the chip join temperature, less stress will be induced in the C4 joints, so that the formation of ULK cracking/white bumps will be minimized and/or eliminated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A fixture assembly, comprising:
    a first plate having an opening sized to accommodate a chip mounted on a laminate;
    a second plate mated to the first plate by at least one mechanical fastening mechanism; and
    a space defined by facing surfaces of the first plate and the second plate and confined by a raised stepped portion of at least one of the first plate and the second plate, the space being coincident with the opening, wherein:
    the space is sized and shaped such that the laminate is confined within the space and directly abuts the stepped portion and the facing surfaces of the first plate and the second plate to be confined in X, Y and Z directions.

2. The fixture assembly of claim 1, wherein the first plate and the second plate have a coefficient of thermal expansion of less than about $17\times10^{-6}/°$ C.

3. The fixture assembly of claim 2, wherein the first plate and the second plate have a coefficient of thermal expansion of less than about $11\times10^{-6}/°$ C.

4. The fixture assembly of claim 3, wherein the first plate and the second plate have a coefficient of thermal expansion of less than about $3\times10^{-6}/°$ C.

5. The fixture assembly of claim 1, wherein the first plate and the second plate are Invar.

6. The fixture assembly of claim 1, wherein the first plate and the second plate are one of stainless steel and machined glass ceramic.

7. The fixture assembly of claim 1, wherein the raised stepped portion is provided on both the first plate and the second plate.

8. The fixture assembly of claim 7, wherein the raised stepped portion of the first plate and the raised stepped portion of the second plate form a closed area in the X and Y direction.

9. The fixture assembly of claim 8, wherein the raised stepped portion of the first plate is an L shape and the raised stepped portion of the second plate is a corresponding L shape.

10. The fixture assembly of claim 8, wherein the raised stepped portion of the first plate is provided on opposing sides and the raised stepped portion of the second plate is provided on other opposing sides.

11. The fixture assembly of claim 1, wherein the space is devoid of gaps between the laminate and the stepped portion.

12. A chip assembly apparatus, comprising:
a first plate having a stepped feature and an opening;
a second plate mated to the first plate, the second plate having a stepped feature which when the first plate and the second plate are mated, form a confined space with the stepped feature of the first plate; and
at least one mechanical fastening mechanism to mate the first plate to the second plate,
wherein, in the confined space, contact is made to a top surface of a laminate about a periphery and to a bottom surface of the laminate by the first plate and the second plate, respectively, and sides of the laminate by the stepped features of the first plate and the second plate.

13. The apparatus of claim 12, wherein the first plate and the second plate have a coefficient of thermal expansion of less than $3\times10^{-6}/°$ C.

14. The apparatus of claim 12, wherein the confined space formed by the stepped features of the first plate and the second plate prevent lateral expansion of the laminate placed within the confined space in an X and Y direction.

15. The apparatus of claim 12, wherein a height of the stepped features of the first plate and the second plate is a same thickness or smaller thickness than the laminate.

16. The apparatus of claim 12, wherein the pressure applied by the first plate and the second plate to the laminate oppose bending and warping of the laminate and prevent lateral expansion of the laminate.

* * * * *